(12) United States Patent
Guiraud

(10) Patent No.: US 7,250,790 B2
(45) Date of Patent: Jul. 31, 2007

(54) CIRCUIT FOR PROVIDING A LOGIC GATE FUNCTION AND A LATCH FUNCTION

(75) Inventor: Lionel Guiraud, Blainville sur Orne (FR)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 10/572,612

(22) PCT Filed: Sep. 10, 2004

(86) PCT No.: PCT/IB2004/002994

§ 371 (c)(1),
(2), (4) Date: Mar. 17, 2006

(87) PCT Pub. No.: WO2005/029703

PCT Pub. Date: Mar. 31, 2005

(65) Prior Publication Data

US 2006/0279337 A1    Dec. 14, 2006

(30) Foreign Application Priority Data

Sep. 22, 2003  (EP) .................................. 03300127

(51) Int. Cl.
*H03K 19/086* (2006.01)

(52) U.S. Cl. ........................................ 326/126; 326/90
(58) Field of Classification Search ................ 326/123, 326/124, 126–128, 82, 89–90
See application file for complete search history.

(56) References Cited

U.S. PATENT DOCUMENTS 4,823,030 A * 4/1989 Wilhelm et al. ............ 326/126
6,559,687 B1 * 5/2003 Hunt ............................ 327/65

FOREIGN PATENT DOCUMENTS

WO    WO 200118962 A1 * 3/2001

* cited by examiner

*Primary Examiner*—James H. Cho

(57) ABSTRACT

An electronic circuit for providing a logic gate function includes a differential signal input, a combining stage, a discriminating stage and a differential signal output. The discriminating stage includes four transistors each having first electrodes and second electrodes and a respective gate electrode. The first electrodes of the four transistors are connected to a common node. The combining stage is arranged to convert differential input signals into gate signals applied to the gate electrodes of some of the four transistors respectively.

16 Claims, 5 Drawing Sheets

CIRCUIT FOR PROVIDING A LOGIC GATE FUNCTION AND A LATCH FUNCTION

CROSS REFERENCE TO RELATED APPLICATIONS

This application is a U.S. National Stage application of International Application No. PCT/11B04/02994, filed Sep. 10, 2004, and claims priority to European Patent Application No. 03300127.2, filed Sep. 22, 2003.

FIELD OF THE INVENTION

The present invention relates to electronic circuits, in particular to electronic circuits for providing a logic gate operating at high speed under low power supply voltage.

BACKGROUND OF THE INVENTION

There is a growing need to lower the operating voltage of logic circuits, for example in order to reduce power consumption. This can be achieved by not stacking differential pairs in a logic circuit. U.S. Pat. No. 5,751,169 describes such a circuit where a first differential pair provides an amplified level-shifted output in response to a first differential input and a second differential pair provides an amplified output in response to a second differential input, these two outputs providing "exclusionary" signals processed by a comparator stage. Using such single stacks of differential pairs of transistors enables to reduce the necessary operative voltage. Nevertheless, in that patent, the "exclusionary" signals are not symmetric because of the level shift in the first pair. As a result, the operating speed of the logic circuit is limited since the comparator stage is not controlled in a differential mode.

OBJECT AND SUMMARY OF THE INVENTION

It is an object of the invention to provide an electronic circuit able to provide a logic gate function under low power supply voltage.

The invention provides an electronic circuit comprising differential signal input means, a combining stage, a discriminating stage and differential signal output means, wherein the discriminating stage comprises four transistors each having respective first and second electrodes and a respective gate electrode for controlling a current flow between said first and second electrodes, wherein the first electrodes of said four transistors are connected to a common node, wherein the differential signal output means comprise a pair of differential output terminals each connected to at least one of the second electrodes of said four transistors, and wherein the combining stage is arranged to convert differential input signals received by the differential signal input means into gate signals respectively applied to the gate electrodes of at least some of said four transistors.

Such an electronic circuit providing differential signal output means enables efficient operation even under low power supply voltage conditions.

Specific embodiments of the invention are defined in dependent claims.

The feature of claim 2 enables selecting a pair of transistors among the transistors of the discriminating stage.

The features of claim 3 enable an easy discrimination.

The features of claim 4 make sure that only one of the transistors of discriminating stage has the highest base level.

Claim 5 reveals a combining stage for providing appropriate signals to gate electrodes of the discriminator stage circuit.

In the particular embodiment set forth in claim 6, an AND or NOR gate is provided.

In the particular embodiment set forth in claim 7, an OR or NAND gate is provided.

In the particular embodiment set forth in claim 8, a XOR gate is provided.

In the embodiment of claim 9, combining stage and discriminating stage are adapted to provide a latch circuit.

In the particular embodiment set forth in claim 10, the circuit latches data from the input signal according to a latch signal.

According to the embodiment of claim 11, it is possible to combine logic gates to realise a complex logic circuit.

BRIEF DESCRIPTION OF THE DRAWINGS

These and other aspects of the invention will be apparent from and elucidated with reference to the embodiments described hereinafter with reference to the drawing figures in which.

DETAILED DESCRIPTION OF THE INVENTION

Figure 1:
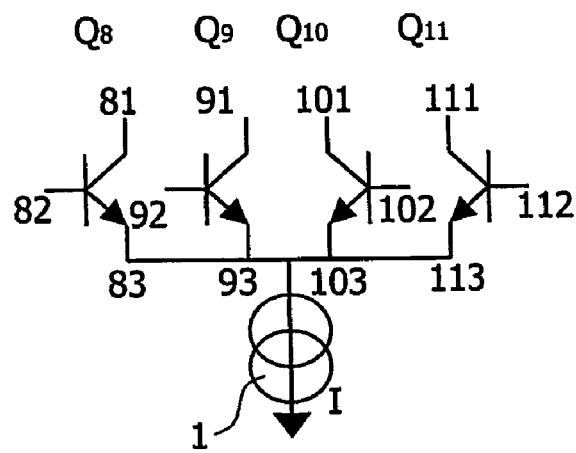
FIG. 1 is a diagrammatic view of the discriminating stage.

The invention is carried out by using a discriminating stage circuit as shown in FIG. 1. The discriminating stage circuit comprises a first pair of transistors, consisting of transistors Q8 and Q11, and a second pair of transistors, consisting of transistors Q9 and Q10. All transistors are preferably identical, being of the same type and size. They can for example be npn-type bipolar transistors as shown in FIG. 1. In this embodiment, each transistor Q8, Q9, Q10 and Q11 includes an emitter 83, 93, 103, 113, a collector 81, 91, 101, 111 and a base 82, 92, 102, 112 respectively to gate current along the collector-emitter path. The four emitters are connected together to a common node. A current sink 1 is connected between that node and a $V_{dd}$ power supply terminal. A DC voltage $V_{cc}$-$V_{dd}$ is applied between that terminal and a $V_{cc}$ supply terminal not shown in FIG. 1. Also not shown in FIG. 1 are resistors connected between the $V_{cc}$ supply terminal and the collectors 81, 91, 101, 111 of the four transistors Q8, Q9, Q10, Q11. These resistors have matched resistance values. Their exact connections depend on the application of the circuits. Examples will be described further on.

When several transistors are connected together by a common emitter terminal, current flows only through the transistor that has the highest base voltage level. To use such a circuit as a discriminating stage of a logic circuit, one needs to ensure that only one of the four transistors has the highest (or lowest) base voltage for all possible combinations of the two input signals to be compared. This is achieved by the invention as described hereinafter.

The bases of the two pairs of transistors of the discriminating stage are driven in the following way: A first differential input signal is used to discriminate which of the two pairs will include the conducting transistor. A second differential input signal is used to discriminate between the two transistors of the pair elected by the first differential input signal. Simultaneously, the second differential input signal also discriminates between the two transistors of the other pair.

The bases 82, 92, 102, 112 of the transistors of the discriminating stage may be driven by tri-state voltage signals as illustrated in FIG. 2. These signals are derived from input differential signals a-aq, and b-bq where xq denotes the logic complement of x. In FIG. 2a, the first input signal b is shown as a solid line, and the complementary signal bq is shown as a dashed line. In FIG. 2b, the second input signal a is shown as a solid line, and the complementary signal aq is shown as a dashed line. Each signal alternately has a high level and a low level depending on the logic values that it conveys.

Figure 2A:
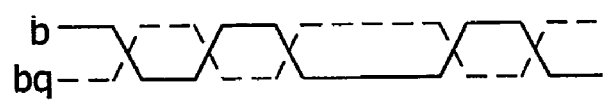
FIGS. 2*a*, 2*b*, 2*c* and 2*d* are diagrammatic views of signal waveforms for the circuit of FIG. 1.
Figure 2B:
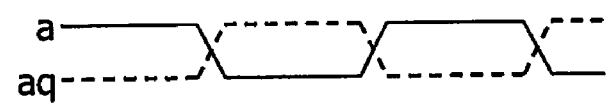
Figure 2C:
Figure 2D:
Figure 3:
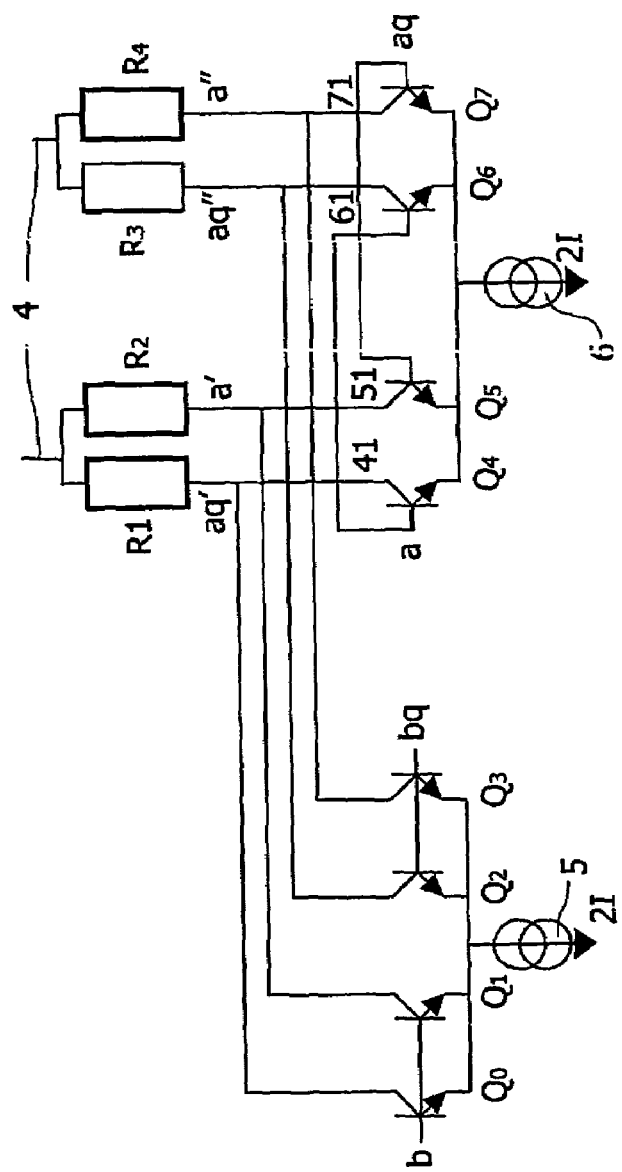
FIG. 3 is a circuit diagram of a combining stage according to the invention.

The input signals are combined in a combining stage an example of which is given in FIG. 3, so that the transistors of the discriminating stage have their respective bases driven by composite signals of first and second input signals b, a and complementary signals bq, aq as depicted in FIGS. 2c and 2d.

The bases 92, 102 of the transistors Q9, Q10 are shown in FIG. 2c in solid and dashed lines respectively. Their common part (in dash-dotted lines) is proportional to the second differential input signal (a-aq) and their differential part is proportional to the first differential input signal (b-bq).

The bases 112, 82 of the transistors Q11, Q8 are shown in FIG. 2d in solid and dashed lines respectively. Their common part (in dash-dotted lines) is proportional to the first differential input signal (b-bq) and their differential part is proportional to the second differential input signal (a-aq).

The three voltage levels of the signals applied to the transistor bases are $V_{cc}$, $V_{cc}$-RI, and $V_{cc}$-2RI, where R and I are predetermined resistance and current values.

Figure 4:
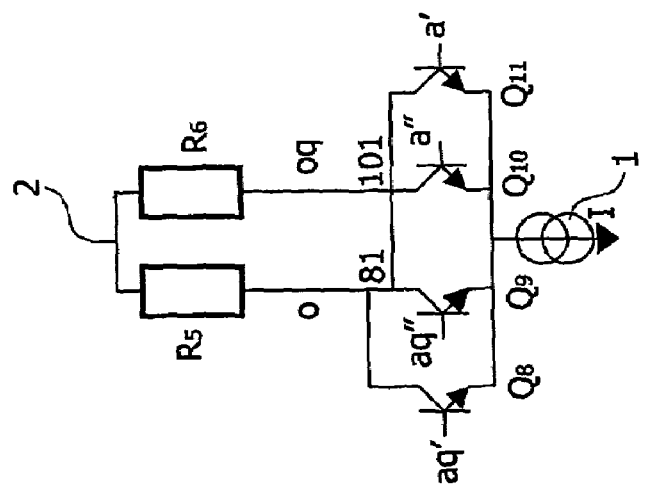
FIG. 4 is a circuit diagram of a discriminating stage performing an AND function according to the invention.

A combining stage, shown on FIG. 3, is adapted to apply the three-state voltage levels to the bases 82, 92, 102 and 112 of the respective transistors Q8, Q9, Q10, Q11 of FIG. 4, based on first input signal b and its complementary input signal bq, and on second input signal a and its complementary input signal aq.

All possible combinations of input signals a and b are shown in FIGS. 2a and 2b.

In FIG. 2c, the base 102 of the transistor Q10 will have its highest base voltage level $V_{cc}$ when both differential input signals are high. If one of the differential input signals is low, the voltage level of the base 102 of the transistor Q10 will decrease by RI to $V_{cc}$-RI. If both differential input signals are low, the voltage level of the base 102 of the transistor Q10 will again decrease by RI to $V_{cc}$-2RI.

Still in FIG. 2c, the base 92 of the transistor Q9 will have its highest base voltage level $V_{cc}$ when a-aq is high and b-bq is low. If either one of a-aq and b-bq changes in voltage level, the voltage level of the base 92 of the transistor Q9 will decrease by RI to $V_{cc}$-RI. If the voltage level of the second differential input signal a-aq is low and the voltage level of the first differential input signal b-bq is high, the voltage level of the base 92 of the transistor Q9 will again decrease by RI to $V_{cc}$-2RI.

In FIG. 2d, the base 112 of the transistor Q11 will have its highest base voltage level $V_{cc}$ when b-bq is high and a-aq is low. If either one of a-aq and b-bq changes in voltage level, the voltage level of the base 112 of the transistor Q11 will decrease by RI to $V_{cc}$-RI. If the voltage level of the second differential input signal a-aq is high and the voltage level of the first differential input signal b-bq is low, the voltage level of the base 112 of the transistor Q11 will again decrease by RI to $V_{cc}$-2RI.

Still in FIG. 2d, the base 82 of the transistor Q8 will have its highest base voltage level $V_{cc}$ when both a-aq and b-bq are low. If one of the differential input signals is high, the voltage level of the base 82 of the transistor Q8 will decrease by RI to $V_{cc}$-RI. If both differential input signals are high, the voltage level of the base 82 of the transistor Q8 will again decrease by RI to $V_{cc}$-2RI.

Accordingly, only one of the four transistor bases is at the highest voltage level for a given combination of input signals a and b, electing the conductive transistor of the discriminating stage.

The circuit of FIG. 3 is only an illustrative example of a suitable way of performing a combination such that a first pair of transistors of the discriminating stage is driven by a signal that has a common mode which is driven by one differential input signal and a differential mode driven by a second differential input signal, while a second pair of transistors of the discriminating stage is driven by a signal that has a common mode which is driven by the second differential input signal and a differential mode driven by the first differential input signal.

Such discriminating stage can be used in order to provide logic circuits. One has to ensure that, given two input signals to be compared, one of a given set of transistors of the discriminating stage connected to a first output terminal will have its base at the highest voltage value if the intended comparison is positive, while one of another set of transistors of the discriminating stage connected to a second output terminal has its base at the highest voltage level if the comparison is negative. Purely illustrative examples are given in the following. Due to the resistors connected between the power supplies and the collectors of the transistors of the discriminating stage, the voltage level of the collector of the ON transistor will be lower than the voltage level of the collectors of the other transistors of the discriminating stage.

FIG. 4 represents a discriminating stage providing a simplified AND logic circuit. Transistors Q8, Q9 and Q11 have a common collector terminal 81 connected to a first differential output terminal o, while transistor Q10 has an individual collector terminal 101 connected to a second differential output terminal oq. A resistor R5 is connected between power supply 2 providing a voltage level of value $V_{cc}$ and a common collector terminal for transistors Q8, Q9 and Q11. A resistor R6 is connected between power supply 2 and the collector terminal of transistor Q10.

The voltage levels of the bases of the transistors of the discriminating stage are defined by the combining circuit (on FIG. 3) in the following way:

if first and second differential input signals a-aq and b-bq are high, the transistor Q10 will have the highest base voltage level and current will flow through Q10. The second differential output terminal will have voltage level $V_{cc}$-RI. In the meantime, the first differential output terminal has voltage level V;

if any of a-aq and b-bq is low, one of transistors Q8, Q9 and Q11 will have the highest base voltage level, and no current will flow through Q10. The first differential output terminal will have voltage level $V_{cc}$-RI. In the meantime, the second differential output terminal has voltage level V.

In order to do so, the combining stage of FIG. 3 is arranged in the following way:
- the base terminals of the transistors Q0 and Q1 receive the first input signal b,
- the base terminals of the transistors Q2 and Q3 receive the first complementary input signal bq,
- the base terminals of the transistors Q4 and Q6 receive the second input signal a,
- the base terminals of the transistors Q5 and Q7 receive the second complementary input signal aq,
- Q0, Q1, Q2 and Q3 share a common emitter terminal, connected to a 2I current sink 5,
- Q4, Q5, Q6 and Q7 share a common emitter terminal, connected to a 2I current sink 6,
- a first resistor R1 is connected between the power supply 4 and a common collector terminal for the transistors Q0 and Q4,
- a second resistor R2 is connected between the power supply 4 and a common collector terminal for the transistors Q1 and Q5,
- a third resistor R3 is connected between the power supply 4 and a common collector terminal for the transistors Q2 and Q6,
- a fourth resistor R4 is connected between the power supply 4 and a common collector terminal for the transistors Q3 and Q7, (R1, R2, R3, R4, R5 and R6 having for example matched resistance values equal to R),
  - the base of transistor Q8 is connected to a common collector terminal 41 of transistors Q0 and Q4,
  - the base of transistor Q9 is connected to a common collector terminal 61 of transistors Q2 and Q6,
  - the base of transistor Q10 is connected to a common collector terminal 71 of transistors Q3 and Q7,
  - the base of transistor Q11 is connected to a common collector terminal 51 of transistors Q1 and Q5.

If the first differential input signal b-bq is high, the transistors Q2 and Q3 will be off and thus the voltage level of their collector terminal will be higher. The pair of transistors Q9–Q10 of the discriminating stage, whose bases are connected to the collector terminals of transistors Q2 and Q3, respectively, is selected. Then, if the second differential input signal a-aq is high, the transistor Q7 will also be off and no current at all will flow through the resistor R4. The base terminal of transistor Q10, which is connected to the common collector terminal of transistors Q7 and Q3 has the highest voltage level of all four transistors of the discriminating stage.

Matter-of-factly, if the first and second differential input signals are high, Q7 and Q3 are off, no current flows through the resistor R4, the collector terminal of transistor Q7 and the base terminal of transistor Q10 are at level V. The transistor Q6 is on and the transistor Q2 off, so the base terminal of transistor Q9 is at level V-RI. Similarly, the transistors Q0 and Q4 are on, thus the base terminal of transistor Q8 is at level V-2RI. The transistor Q1 is on and the transistor Q5 off, thus the base terminal of transistor Q11 is at level V-RI.

Current therefore flows through transistor Q10, and the second differential output terminal has voltage level V-RI, indicating both first and second differential input signals are high. If any of the first and second differential input signals is low, either Q8, Q9 or Q11 will be the transistor with the highest base voltage level, as seen in Table 1. The first output terminal has voltage level V-RI, indicating that either first or second differential input signals or both are low. Accordingly, a NOR logic gate is readily achieved by the same circuit.

TABLE 1

|  | On | Off | aq' | aq" | a" | a' |
|---|---|---|---|---|---|---|
| a = 1, b = 1 | Q0 Q1 Q4 Q6 | Q2 Q3 Q5 Q7 | Vcc-2RI | Vcc-RI | Vcc | Vcc-RI |
| a = 1, b = 0 | Q2 Q3 Q4 Q6 | Q0 Q1 Q5 Q7 | Vcc-RI | Vcc-2RI | Vcc-RI | Vcc |
| a = 0, b = 1 | Q0 Q1 Q5 Q7 | Q2 Q3 Q4 Q6 | Vcc-RI | Vcc | Vcc-RI | Vcc-2RI |
| a = 0, b = 0 | Q2 Q3 Q5 Q7 | Q0 Q1 Q4 Q6 | Vcc | Vcc-RI | Vcc-2RI | Vcc-RI |

Figure 5:
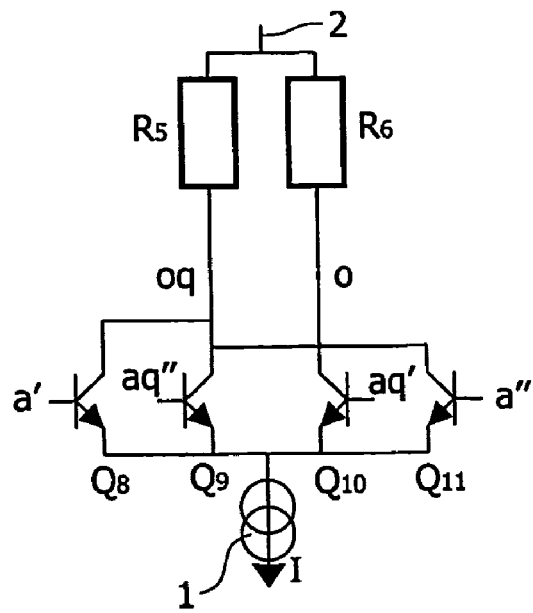
FIG. 5 is a circuit diagram of a discriminating stage performing an OR function according to the invention.

All logic functions can be readily achieved using the same combining stage of FIG. 3. FIG. 5 shows an exemplary discriminating stage providing a logic OR according to the teachings of the invention. Compared to the logic AND from FIG. 4, only few changes are performed in the discriminating stage, which is adapted so that if either first or second differential input signal is high, the second differential output terminal has voltage level V-RI. In order to do so, the connections of bases of transistors Q8 and Q10 are exchanged so that transistor Q10 gets the higher base voltage level when both differential input signals are low. Accordingly, a NAND gate is readily achieved by the same circuit.

Discriminating stage of FIG. 4 and FIG. 5 can be made symmetric by connecting two additional passive collectors, only used as resistive elements, on output terminals oq and o respectively.

Figure 6:
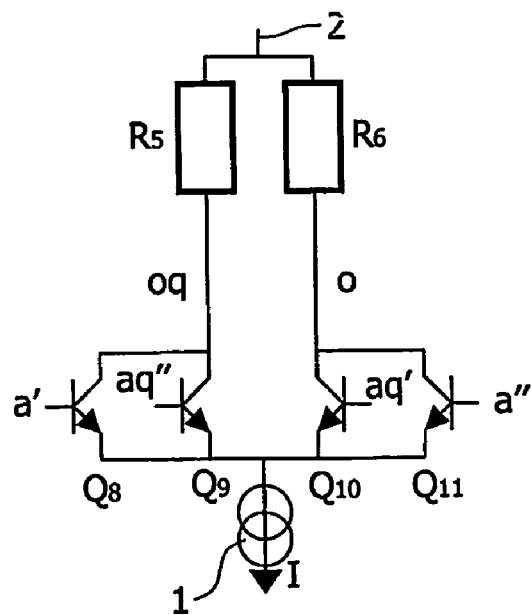
FIG. 6 is a circuit diagram of a discriminating stage performing an XOR function according to the invention.

FIG. 6 shows an exemplary discriminating stage providing a logic XOR Compared to the logic OR from FIG. 5, few changes are performed in the discriminating stage only, which is adapted in a way that, if the first and second differential input signals are simultaneously high or low, the base of one of transistors Q8 or Q9 will have the higher voltage level, whereas in other cases, the base of one of transistors Q10 or Q11 will have the higher voltage level. As an additional feature of the invention, the logic XOR provided here is perfectly symmetric with respect to the two differential inputs, unlike state of the art XORs.

The inventive circuit could therefore be used in many logic circuits, of which the circuits described hereinabove are but a few examples.

Figure 7:
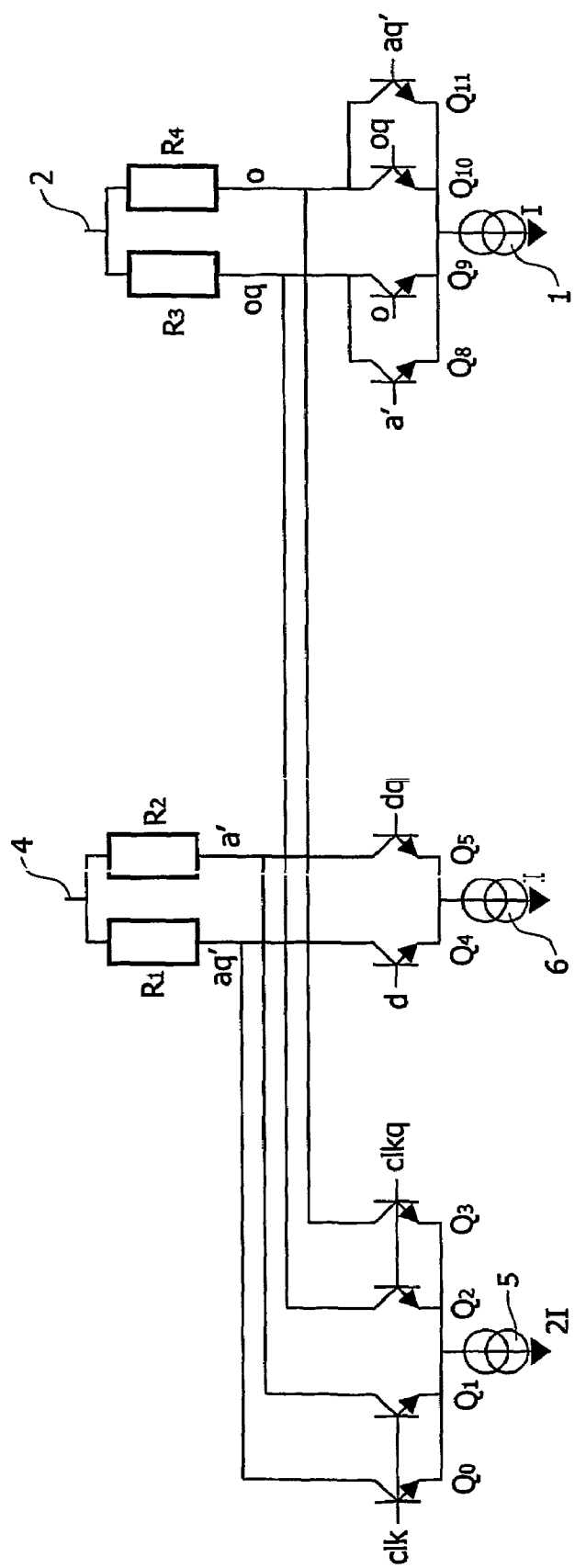
FIG. 7 is a circuit diagram of a latch circuit according to the invention.

The circuit could also be used in order to realise a latch circuit, of which an example is given in FIG. 7:
- the transistors Q0, Q1, Q2 and Q3 share a common emitter terminal which is connected to a 2I current sink 5,
- a latch control signal clk is input to the base terminals of transistors Q0 and Q1,
- a complementary latch control signal clkq is input to the base terminals of transistors Q2 and Q3,
- a resistor R1, R2 is connected between the power supply 4 and the collector terminals of transistors Q0 and Q1 respectively,
- a resistor R3, R4 is connected between the power supply 2 and the collector terminals of transistors Q2 and Q3 respectively,
- the transistors Q4 and Q5 have a common emitter terminal connected to an I current sink 6, the base terminals of transistors Q4 and Q5 receive an input data signal (d) and a complementary input data signal (dq) respectively, the resistors R1 and R2 connect the collector terminals of transistors Q4 and Q5, respectively, to the power supply 4. The transistors Q4 and Q5 thus share a common collector terminal with the transistors Q0 and Q1 respectively, the transistors Q8, Q9, Q10 and Q11 have a common emitter terminal connected to an I current sink 1, resistor R3 connects the common collector terminal of transistors Q8 and Q9, where the complementary output signal is taken, to the power supply 2, resistor R4 connects the common collector terminal of transistors Q10 and Q11, where the output signal is taken, to the power supply 2, the base terminals of transistors Q9 and Q10 receive the output signal and the complementary output signal from the collector terminals of transistors Q11 and Q8, respectively, the base terminals of transistors Q8 and Q11 receive signals from the collector terminals of transistors Q5 and Q4, respectively.

Thus, in a first state of the differential latch control signals, the signals input to the base terminals of transistors Q8 and Q11 by the combining stage have voltage levels higher than the signals input to the bases of transistors Q9 and Q10 by the discriminating stage itself. In a second state of the differential latch control signals, the signals input to the bases of transistors Q8 and Q11 by the combining stage have voltage levels lower than the signals input to the bases of transistors Q9 and Q10 by the discriminating stage itself. In that state, changing the differential input data signal will not change the conducting transistor from Q8, Q9, Q10 and Q11. Data is thus latched until the state of the latch control signals changes.

Figure 8:
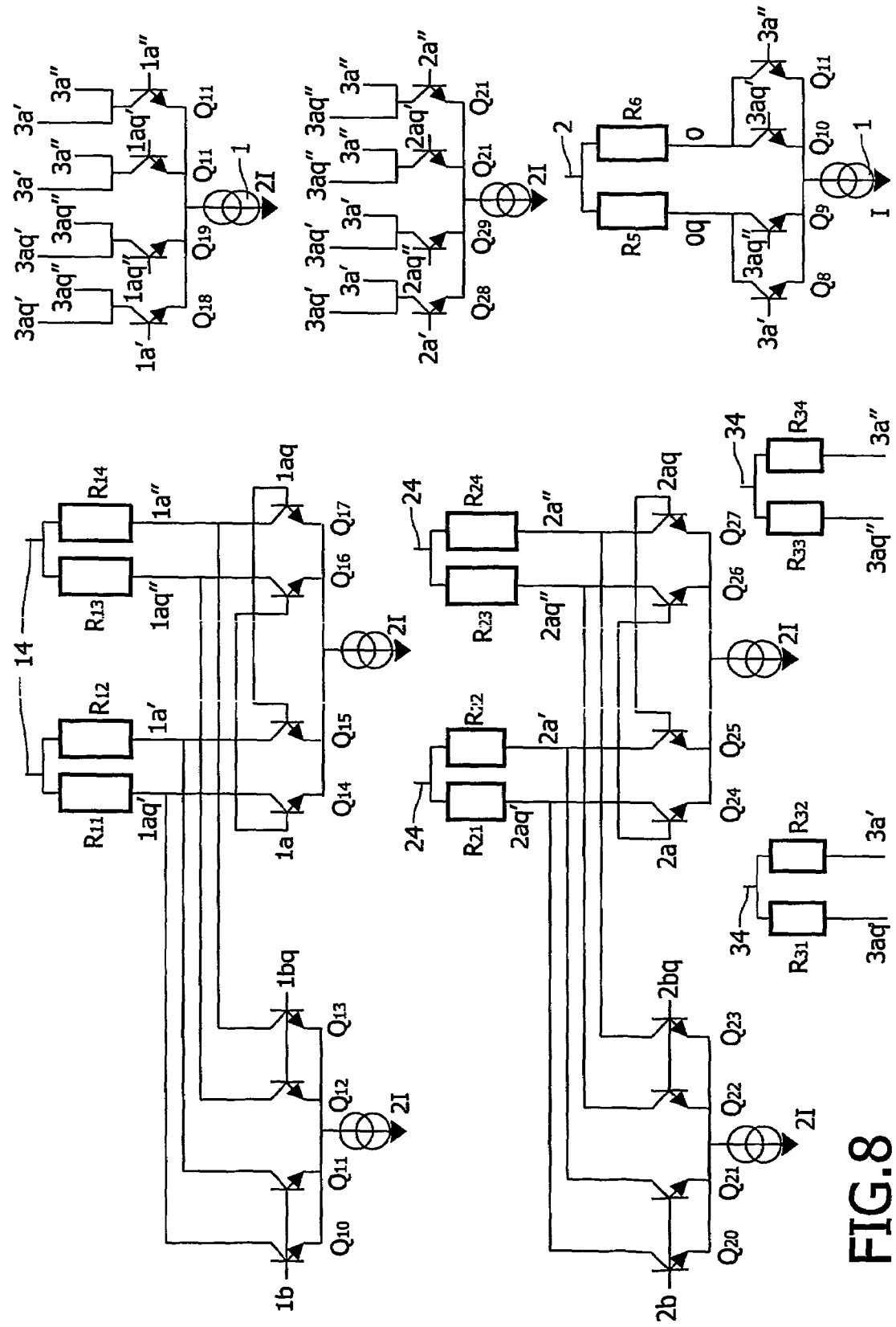
FIG. 8 is a diagrammatic view of more complex logic circuit.

In some complex logical function, the discriminating stage can be used as a next stage driver as shown on the non-limitative example of FIG. 8. In this embodiment, gate signals applied to discriminating stage can be more complex combinations of more than two differential input signals. FIG. 8 includes a first pre-discriminating stage identical to the circuit of FIG. 6. Differential input signals 1b-1bq and 1a-1aq are input to the first pre-discriminating stage in the way already described, and combined signals are input to respective bases of four transistors Q18, Q19, Q110 and Q111 of a first pre-discriminating stage. Two different resistors taken from R31, R32, R33 and R34 are connected between the power supply 34 and the collector terminal of each of these transistors respectively. Collector terminals of transistors Q18 and Q19 are each connected to first 3a' and third 3aq" intermediate terminals, the collector terminals of transistors Q110 and Q111 are each connected to second 3a' and fourth 3a" intermediate terminals.

The circuit also includes a second pre-discriminating stage identical to that of FIG. 6. Differential input signals 2b-2bq and 2a-2aq are input to the second pre-discriminating stage in the way already described, and combined signals are input to respective bases of four transistors Q28, Q29, Q210 and Q211 of a second pre-discriminating stage. Two different resistors taken from R31, R32, R33 and R34 are connected between the power supply 34 and the collector terminal of each of these transistors respectively. The collector terminals of transistors Q28 and Q29 are each connected to first 3aq' and second 3a' intermediate terminals.

The collector terminals of transistors Q210 and Q211 are each connected to third 3aq" and fourth 3a" intermediate terminals.

The discriminating stage includes four transistors Q8, Q9, Q10, Q11 connected in that example in the way used for the XOR gate of FIG. 5. The base terminals of the four transistors of the discriminating stage are connected to a respective one of the intermediate terminals.

If 1a-1aq and 1b-1aq are high, transistors Q17 and Q13 of first pre-discriminating stage will be blocked, and Q111 will have the highest base voltage level. Current will flow through Q111, which is connected to intermediate terminals 3a' and 3a" through the resistors R32 and R34, and 3a' and 3a" voltage levels will decrease.

If 2a-2aq and 2b-2bq are high, Q27 and Q23 of second pre-discriminating stage will be blocked, and Q211 will have the highest base voltage level. Current will flow through Q211, which is connected to intermediate terminals 3aq" and 3a" through the resistors R33 and R34, and 3aq" and 3a" voltage levels will decrease.

Thus, no current is flowing through resistor R31 associated to signal 3aq', and the base terminal of Q10, which is connected to the intermediate terminal receiving signal 3aq', will have the highest voltage level. Q10 is thus on and current will flow through Q10. Voltage level of output terminal o will thus be lower than voltage level of second output terminal oq.

Other states of input signals 1a, 1b, 2a and 2b and will provide different differential output signals in differential output terminals. By changing the connections in the first and second pre-discriminating stages and in the discriminating stage, any logic circuit can thus be provided for two or more input signals.

Though a particular arrangement is presented, a similar circuit can combine any kind of logic or latch gates as previously described into a combined logic function of three and more differential input signals at high speed even under low power supply voltage.

The invention claimed is:

1. An electronic circuit comprising:
   differential signal input means,
   a combining stage,
   a discriminating stages, and
   differential signal output means,
   wherein the discriminating stage comprises four transistors each having respective first and second electrodes and a respective gate electrode for controlling a current flow between said first and second electrodes,
   wherein the first electrodes of said four transistors are connected to a common node,
   wherein the differential signal output means comprise a pair of differential output terminals each connected to at least one of the second electrodes of said four transistors, and
   wherein the combining stage is arranged to convert differential input signals received by the differential signal input means into four gate signals respectively applied to the gate electrodes of said four transistors.

2. An electronic circuit as claimed in claim 1, wherein at least a first pair of gate electrodes receives a gate signal which has a common mode driven by a first differential input signal and a differential mode driven by a second differential input signal.

3. An electronic circuit as claimed in claim 2 wherein a second pair of gate electrodes receives a gate signal which has a common mode driven by the second differential input signal and a differential mode driven by the first differential input signal.

4. An electronic circuit as claimed in claim 1 for providing a latch function, wherein the differential signal input means include a pair of differential input terminals for receiving differential latch control signals, wherein the differential output terminals are respectively connected to the gate electrodes of two of said four transistors for applying thereto respective gate signals corresponding to differential output signals of the circuit, and wherein the combining and discriminating stages are so arranged that the gate signals provided by the combining stage have voltage levels higher than said differential output signals in a first state of the differential latch control signals and lower than said differential output signals in a second state of the differential latch control signals.

5. An electronic circuit as claimed in claim 4, wherein the differential signal input means further include a pair of differential input terminals for receiving a pair of differential input data signals, wherein the combining stage includes a first group of four combining transistors, a second group of two combining transistors, first current generator means for generating a first current between a first node and a first power supply terminal, second current generator means for generating a second current between a second node and the first power supply terminal, and first and second resistors each having a respective first end connected to first power supply terminal and a respective second end, wherein the discriminating stage further includes third and fourth resistors having respective first ends connected to a second power supply terminal and second ends respectively connected to the pair of differential output terminals, wherein each of the combining transistors has respective first and second electrodes and a respective gate electrode for controlling a current flow between said first and second electrodes, wherein the first electrodes of the four combining transistors of the first group are connected in common to said first node, and the first electrodes of the two combining transistors of the second group are connected in common to said second node, wherein the pair of differential latch control signals includes a signal (clk) applied to the gate electrodes of two combining transistors (Q0, Q1) of the first group, which combining transistors have their second electrodes connected to the second ends of said first and second resistors respectively, and a signal (clkq) applied to the gate electrodes of the two other combining transistors (Q2, Q3) of the first group, which other combining transistors have their second electrodes connected to the second ends of said third and fourth resistors respectively, wherein the pair of differential input data signals includes a signal (a) applied to the gate electrode of one combining transistor (Q4) of the second group, which combining transistor has its second electrode connected to the second end of said first resistor, and a signal (aq) applied to the gate electrode of the other combining transistor (Q5) of the second group, which other combining transistor has its second electrode connected to the second end of said second resistor, and wherein said four transistors of the discriminating stage include a transistor (Q8) having its gate electrode connected to the second end of the second resistor and its second electrode connected to the second end of the third resistor, a transistor (Q9) having its gate electrode connected to the second end of the fourth resistor and its second electrode connected to the second end of the third resistor, a transistor (Q10) having its gate electrode connected to the second end of the third resistor and its second electrode connected to the second end of the fourth resistor, and a transistor (Q11) having its gate electrode connected to the second end of the first resistor and its second electrode connected to the second end of the fourth resistor.

6. An electronic circuit according to claim 1 wherein said combining stage comprises:

a first pre-combining stage, a first pre-discriminating stage and first differential signal intermediate means, wherein the first pre-disseminating stage comprises four transistors each having respective first and second electrodes and a respective gate electrode for controlling a current flow between said first and second electrodes, wherein the first electrodes of said four transistors are connected to a common node, wherein the first differential signal intermediate means comprise two pairs of first differential intermediate terminals each connected to two of the second electrodes of said four transistors, and wherein the first pre-combining stage is arranged to convert a first pair of differential input signals received by the differential signal input means into gate signals applied to the gate electrodes of at least some of said four transistors of first pre-discriminating stage respectively, a second pre-combining stage, a second pre-discriminating stage and second differential signal intermediate means, wherein the second pre-discriminating stage comprises four transistors each having respective first and second electrodes and a respective gate electrode for controlling a current flow between said first and second electrodes, wherein the first electrodes of said four transistors are connected to a common node, wherein the second differential signal intermediate means comprise two pairs of second differential intermediate terminals each connected to at least two of the second electrodes of said four transistors, and wherein the second pre-combining stage is arranged to convert a second pair of differential input signals received by the differential signal input means into gate signals applied to the gate electrodes of at least some of said four transistors of second discriminating stage respectively, and wherein the combining stage is arranged to convert intermediate signals received by first and second differential intermediate terminals into the gate signals applied to the gate electrodes of at least some of said four transistors of discriminating stage respectively.

7. The electronic circuit of claim 1, wherein the combining stage is adapted to receive a first differential input signal pair a and aq and a second differential input signal pair b and bq and is adapted to convert the first and second differential input signal pair into the four gate signals to be applied to the gate electrodes of the four transistors of the discriminating stage.

8. The electronic circuit of claim 7, where the combining stage is adapted to convert the first and second differential input signal pairs into the four gate signals as (a+b), (a+bq), (bq+a) and (aq+bq), respectively, to be applied to the gate electrodes of the four transistors of the discriminating stage.

9. An electronic circuit comprising:
differential signal input means;
a combining stage;
a discriminating stage; and
differential signal output means,
wherein the discriminating stage comprises four transistors each having respective first and second electrodes and a respective gate electrode for controlling a current flow between said first and second electrodes,
wherein the first electrodes of said four transistors are connected to a common node,
wherein the differential signal output means comprise a pair of differential output terminals each connected to at least one of the second electrodes of said four transistors,
wherein the combining stage is arranged to convert differential input signals received by the differential signal input means into gate signals respectively applied to the gate electrodes of at least some of said four transistors, and
wherein the gate signals applied to the respective gate electrodes of the four transistors of the discriminating stage are tri-state voltage signals so designed that a single one of said gate electrodes, selected from the differential input signals received by the differential signal input means, has a maximum or minimum voltage value.

10. An electronic circuit as claimed in claim 9, wherein at least a first pair of the gate electrodes receives a gate signal which has a common mode driven by a first differential input signal and a differential mode driven by a second differential input signal.

11. An electronic circuit as claimed in claim 10 wherein a second pair of the gate electrodes receives a gate signal which has a common mode driven by the second differential input signal and a differential mode driven by the first differential input signal.

12. An electronic circuit as claimed in claim 9, wherein the differential signal input means include two pairs of differential input terminals for respectively receiving first and second pairs of differential input data signals
wherein the combining stage includes first and second groups of four combining transistors, first current generator means for generating a first current between a first node and a first power supply terminal, second current generator means for generating a second current between a second node and the first power supply terminal, and first, second, third and fourth resistors each having a respective first end connected to the first power supply terminal and a respective second end,
wherein each of the combining transistors has respective first and second electrodes and a respective gate electrode for controlling a current flow between said first and second electrodes,
wherein the first electrodes of the four combining transistors of the first group are connected in common to said first node, and the first electrodes of the four combining transistors of the second group are connected in common to said second node,
wherein the first pair of differential input data signals includes a signal (b) applied to the gate electrodes of two combining transistors (Q0, Q1) of the first group, which combining transistors have their second electrodes connected to the second ends of said first and second resistors respectively, and a signal (bq) applied to the gate electrodes of the two other combining transistors (Q2, Q3) of the first group, which other combining transistors have their second electrodes connected to the second ends of said third and fourth resistors respectively,
wherein the second pair of differential input data signals includes a signal (a) applied to the gate electrodes of two combining transistors (Q4, Q6) of the second group, which combining transistors of the second group have their second electrodes connected to the second ends of said first and third resistors respectively, and a signal (aq) applied to the gate electrodes of the two other combining transistors (Q5, Q7) of the second group, which other combining transistors of the second group have their second electrodes connected to the second ends of said second and fourth resistors respectively, and
wherein the second ends of the first, second, third and fourth resistors are connected to the gate electrodes of the four transistors of the discriminating stage respectively.

13. An electronic circuit for providing a logic gate function, comprising:
differential signal input means;
a combining stage;
a discriminating stage; and
differential signal output means,
wherein the discriminating stage comprises four transistors each having respective first and second electrodes and a respective gate electrode for controlling a current flow between said first and second electrodes,
wherein the first electrodes of said four transistors are connected to a common node,
wherein the differential signal output means comprise a pair of differential output terminals each connected to at least one of the second electrodes of said four transistors,
wherein the combining stage is arranged to convert differential input signals received by the differential signal input means into gate signals respectively applied to the gate electrodes of at least some of said four transistors,
wherein the differential signal input means include two pairs of differential input terminals for respectively receiving first and second pairs of differential input data signals
wherein the combining stage includes first and second groups of four combining transistors, first current generator means for generating a first current between a first node and a first power supply terminal, second current generator means for generating a second current between a second node and the first power supply terminal, and first, second, third and fourth resistors each having a respective first end connected to the first power supply terminal and a respective second end,
wherein each of the combining transistors has respective first and second electrodes and a respective gate electrode for controlling a current flow between said first and second electrodes,
wherein the first electrodes of the four combining transistors of the first group are connected in common to said first node; and the first electrodes of the four combining transistors of the second group are connected in common to said second node,
wherein the first pair of differential input data signals includes a signal (b) applied to the gate electrodes of two combining transistors (Q0, Q1) of the first group, which combining transistors have their second electrodes connected to the second ends of said first and second resistors respectively, and a signal (bq) applied to the gate electrodes of the two other combining transistors (Q2, Q3 ) of the first group, which other combining transistors have their second electrodes connected to the second ends of said third and fourth resistors respectively, wherein the second pair of differential input data signals includes a signal (a) applied to the gate electrodes of two combining transistors (Q4, Q6) of the second group, which combining transistors of the second group have their second electrodes connected to the second ends of said first and third resistors respectively, and a signal (aq) applied to the gate electrodes of the two other combining transistors (Q5, Q7) of the second group, which other combining transistors of the second group have their second electrodes connected to the second ends of said second and fourth resistors respectively, and wherein the second ends of the first, second, third and fourth resistors are connected to the gate electrodes of the four transistors of the discriminating stage respectively.

14. An electronic circuit as claimed in claim 13 for providing a logic AND or NOR function, wherein said pair of differential output terminals has a first terminal connected to the second electrodes of three of the four transistors of the discriminating stage, which transistors have their respective gate electrodes connected to the second ends of said first, second and third resistors, and a second terminal connected to the second electrode of the other one of the four transistors of the discriminating stage, which other transistor has its gate electrode connected to the second end of said fourth resistor.

15. An electronic circuit as claimed in claim 13 for providing a logic OR or NAND function, wherein said pair of differential output terminals has a first terminal connected to the second electrode of one of the four transistors of the discriminating stage, which transistor has its gate electrode connected to the second end of said first resistor, and a second terminal connected to the second electrodes of the three other ones of the four transistors of the discriminating stage, which three transistors have their respective gate electrodes connected to the second ends of said second, third and fourth resistors.

16. An electronic circuit as claimed in claim 13 for providing a logic EXCLUSIVE OR function, wherein said pair of differential output terminals has a first terminal connected to the second electrodes of two of the four transistors of the discriminating stage, which two transistors have their respective gate electrodes connected to the second ends of said second and third resistors, and a second terminal connected to the second electrodes of the other two of the four transistors of the discriminating stage, which other two transistors have their respective gate electrodes connected to the second ends of said first and fourth resistors.

* * * * *